United States Patent
Zomagbouelou et al.

(10) Patent No.: US 11,088,664 B2
(45) Date of Patent: Aug. 10, 2021

(54) AMPLITUDE SWEEP GENERATOR AND METHOD

(71) Applicant: Stichting IMEC Nederland, Eindhoven (NL)

(72) Inventors: Wilfried Zomagbouelou, Eindhoven (NL); Paul Mateman, Millingen a/d Rijn (NL); Yao-Hong Liu, Eindhoven (NL)

(73) Assignee: IMEC vzw, Leuven (BE)

( * ) Notice: Subject to any disclaimer, the term of this patent is extended or adjusted under 35 U.S.C. 154(b) by 40 days.

(21) Appl. No.: 16/714,128

(22) Filed: Dec. 13, 2019

(65) Prior Publication Data
US 2020/0195211 A1 Jun. 18, 2020

(30) Foreign Application Priority Data
Dec. 13, 2018 (EP) .................................... 18212401

(51) Int. Cl.
*H03F 3/72* (2006.01)
*H03F 3/24* (2006.01)
*G06F 7/58* (2006.01)

(52) U.S. Cl.
CPC ............. *H03F 3/245* (2013.01); *G06F 7/584* (2013.01); *H03F 2203/21145* (2013.01)

(58) Field of Classification Search
CPC ... H03F 3/24; H03F 3/245; H03F 3/68; H03F 3/72; H03F 2203/21145
USPC .................................................. 330/51, 295
See application file for complete search history.

(56) References Cited

U.S. PATENT DOCUMENTS

| 3,893,115 A | 7/1975 | Linder |
| 2009/0080241 A1 | 3/2009 | Gutala et al. |
| 2010/0231305 A1* | 9/2010 | Mizokami ............... H03F 3/195 330/310 |
| 2015/0015338 A1 | 1/2015 | Okada |

FOREIGN PATENT DOCUMENTS

| EP | 2251976 A1 | 11/2010 |
| FR | 2336831 A1 | 7/1977 |

OTHER PUBLICATIONS

European Search Report, European Patent Application No. 18212401.6, dated Jun. 18, 2019, 11 pages.

* cited by examiner

*Primary Examiner* — Steven J Mottola
(74) *Attorney, Agent, or Firm* — McDonnell Boehnen Hulbert & Berghoff LLP

(57) ABSTRACT

A signal generator is configured to generate a signal with an amplitude sweep, the signal generator having circuitry comprising: a set of control components, each control component of the set being arranged to be switchably activated in parallel in the circuitry such that an amplitude of the signal has an intrinsic dependence on the number of the control components activated; a shift register controllable by a clock line and comprising a number of bits, each bit of the number of bits controlling activation of a respective control component of the set of control components such that the control components are arranged to be activated or de-activated in a pre-determined order by shifting activation or de-activation bits into the shift register, wherein the shifting is paced by the clock line; and a clock signal generator configured to output a clock signal with a time modulation on the clock line.

20 Claims, 4 Drawing Sheets

AMPLITUDE SWEEP GENERATOR AND METHOD

CROSS-REFERENCE TO RELATED APPLICATIONS

The present application is a non-provisional patent application claiming priority to European Patent Application No: EP 18212401.6, filed on Dec. 13, 2018, the contents of which are hereby incorporated by reference.

FIELD OF THE DISCLOSURE

The present disclosure relates to a signal generator configured to generate a signal with an amplitude sweep. Further, the present disclosure relates to a method of generating a signal with an amplitude sweep.

BACKGROUND

Signal generators configured to generate an amplitude sweep are, for example, useful for biomedical applications, such as biomedical radar systems. This requires a fine resolution, circuit area efficiency, and low power. For example, such amplitude sweeps may be generated using switchable parallel power amplifier (PA) units or by switchable resistors in the signal generator circuitry.

SUMMARY

An objective of the present disclosure is to provide a signal generator configured to generate an amplitude sweep with high accuracy with respect to a desired time profile of the amplitude sweep while retaining low circuit complexity. Additionally or alternatively, an objective is to provide a signal generator configured to generate an amplitude sweep with a high degree of linearity.

According to an aspect of the present disclosure, there is provided a signal generator configured to generate a signal with an amplitude sweep, the signal generator having circuitry comprising: a set of control components, each control component of the set of control components being arranged to be switchably activated in parallel in the circuitry so that an amplitude of the signal has an intrinsic dependence on the number of the control components activated; a shift register controllable by a clock line and comprising a number of bits, each bit of the number of bits controlling activation of a respective control component of the set of control components so that the control components are arranged to be activated or de-activated in a pre-determined order by shifting, respectively, activation or de-activation bits into the shift register, wherein the shifting is paced by the clock line; and a clock signal generator configured to output a clock signal with a time modulation on the clock line.

The present disclosure is applicable to any signal generator arrangement where the amplitude of the signal has an intrinsic dependence on the number of control components activated. The control components may for example be power amplifier (PA) units, resistors, or current sources.

The bits comprised in the shift register may typically be input into the shift register using a data line. Upon an activation signal on the clock line, which for example may be a leading edge of the clock signal, the signal on the data line is stored in the first bit of the shift register, while the bit previously stored there is moved to the second bit, and so on. If, for example, the shift register starts in a state with all deactivation bits (typically "0" bits), meaning that no control components are connected in the circuit, an activation bit (typically a "1" bit) may be shifted into the first bit of the shift register upon activation of the clock signal, switching the corresponding control component into the circuit, simultaneously changing the signal amplitude. Upon the next leading edge of the clock signal, another one bit may be shifted into the shift register, so that the first two bits now are activation bits, while the rest of the bits are deactivation bits, further changing the amplitude of the signal generator, and so on. Thus, pacing of this shifting, i.e., the time between the shifts in signal amplitude, is controlled by the clock line. This typically leads to a sweep towards decreasing amplitude.

In another equally possible mode of operation, the shift register may start in a state with all activation bits, meaning that all control components of the set of control components are connected in the circuit. Deactivation bits may then successively be shifted into the shift register, typically leading to a sweep towards decreasing amplitude.

The intrinsic dependence of the amplitude of the signal on the number of activated control components may be either linear or non-linear, depending on the kind of control components used and how they are arranged. In a general case, the signal generator is configured to generate the amplitude sweep with a specific time dependence, the time modulation being based on the specific time dependence of the amplitude sweep in relation to the intrinsic dependence of the amplitude of the signal on the number of control components activated, so that the signal generator generates the amplitude sweep with the specific time dependence. In other words, the time modulation may be adjusted based on the time profile of a desired amplitude sweep, so that the signal generator generates the amplitude sweep with that desired time dependence.

As one example, the desired time dependence of the amplitude sweep may be a linear ramp and the intrinsic dependence of the amplitude of the signal on the number of activated control components may be non-linear. The time modulation of the clock signal will then serve to compensate for any non-linearity relative to this desired linear ramp. Such amplitude non-linearity may, for example, come from systems where power, rather than amplitude, adds up linearly, leading to a square-root dependence of the generated signal amplitude as a function the number control components activated. It may also be due to second-order effects such as supply resistance or internal resistance.

In another example, the intrinsic dependence of the amplitude of the signal on the number of activated control components may be linear, or close to linear, while the desired time dependence of the amplitude of the generator signal is non-linear.

Desired non-linear amplitude sweeps may for example, as a function of time, be exponential, i.e., the amplitude being linear as expressed in decibels, have a square root time dependence, or be a polynomial, such as a square function.

By time-modulating the clock signal controlling the shift register, i.e., letting it have a varying time between activation signals on the clock line, such as a gradually increasing or decreasing clock frequency, a desired amplitude sweep may be achieved while at the same time allowing for a relatively low circuit complexity, as only two control lines— the data line and the control line—are needed. Further, this approach is well suited for fast amplitude ramping.

According to an embodiment, the signal generator is an RF transmitter and each control component of the set of control components is a power amplifier unit. In this case, the power output of each of the power amplifier units will then add up in the output signal.

For example, in a case of each power amplifier unit generating the same power, the amplitude of the signal output by the signal generator may be proportional, or roughly proportional, to the square root of the number of activated power amplifier units. If a linear amplitude sweep is desired, when generating an amplitude sweep, the time-modulated clock signal will be able to compensate for this non-linearity. Hereby, good sweep linearity can be achieved with a simple design. Further, this allows for the use of simpler and more efficient power amplifier units, as the power of each power amplifier unit is considerably smaller than the total maximum power of the RF transmitter, while still allowing for good sweep linearity though the time-modulated clock signal.

According to an embodiment, the signal generator further comprises an output stage configured to output the signal, the output stage being controlled by a bias current generated by a bias current source controlled by the set of control components. Typically, the signal generator is an RF transmitter and the output stage is a power amplifier unit. In this case, non-linearity in the generated amplitude sweep is due to non-linearity between the bias current and the amplitude output by the output stage. When generating an amplitude sweep, the time-modulated clock signal approach will be equally well suited to compensate for this non-linearity, again allowing for good sweep linearity with a relatively simple circuit design.

According to an embodiment, each control component of the set of control components is a current source configured to generate a contributor current, a sum of each the contributor current controlling the bias current source. This allows for a flexible, yet simple, way of controlling the bias current source.

According to an embodiment, the bias current source is a current mirror. This leads to addition of the contributor currents to form the bias current in a reliable way.

According to an embodiment, each control component of the set of control components comprises a resistor in series with a transistor controlled by a bit of the shift register. This is a simple, yet reliable, implementation of a current source.

According to another aspect of the present disclosure, there is provided a method of generating a signal with an amplitude sweep, the method comprising: shifting activation or de-activation bits into a shift register, the shift register comprising a number of bits, each bit of the number of bits controlling activation of a respective control component of a set of control components in parallel in circuitry of a signal generator, the control components being activated or de-activated in a pre-determined order by the shifting of the activation or deactivation bits, the amplitude of the signal having an intrinsic dependence on the number of the control components activated, wherein the shifting is paced by a clock signal having a time modulation.

BRIEF DESCRIPTION OF THE FIGURES

The above, as well as additional, features will be better understood through the following illustrative and non-limiting detailed description of example embodiments, with reference to the appended drawings. In the drawings like reference numerals will be used for like elements unless stated otherwise.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1A:
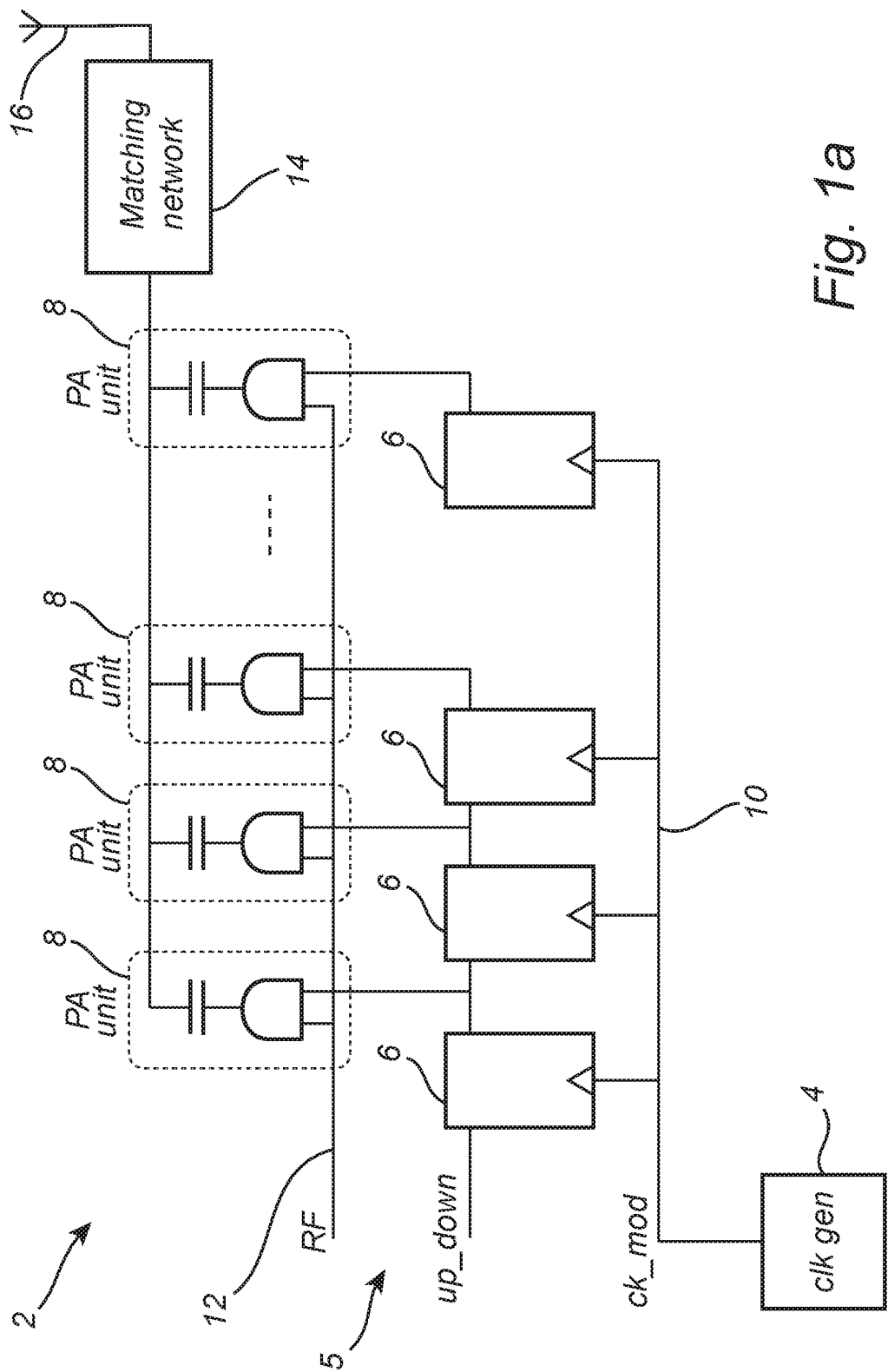
FIGS. 1a and 1b are schematics of signal generators, each with an embedded switch register, the clock signal of which is controlled by a clock signal generator, according to an example embodiment.

FIG. 1a illustrates a signal generator 2. The signal generator 2 comprises a shift register 5 and a clock signal generator 4 and is configured to generate an amplitude sweep. In this embodiment, the signal generator 2 is an RF transmitter. Each bit 6 of the shift register controls a respective power amplifier (PA) unit 8. Thus, the PA units 8 form a set of control components, where each PA unit 8, i.e., control component, of the set of control components is arranged to be switchably activated in parallel in the signal generator 2. Typically, all PA units 8, when activated, generate the same power P step. The switching may for example occur through transistors, such as MOSFET transistors. Further, each PA unit 8 is fed with an RF signal 12 generated by an RF signal generator (not shown). The RF signal 12 is amplified by each activated PA unit 8. The PA units 8 are connected in parallel and fed into a matching network 14, which feeds a transmitting antenna 16. In this specific embodiment, the amplitude of the signal generator will be proportional to the square root of the total power P of the PA units 8, which in the case of all PA units 8 having the same power $P_{step}$ will amount to the number of activated PA units 8 n multiplied by $P_{step}$. Thus, the amplitude of the generated signal has an intrinsic dependence on the number of PA units 8 activated.

However, the specific signal generator configuration illustrated in FIG. 1a is not the only possibility. Rather, use of a shift register controlled by a time-modulated clock signal is applicable to any signal generator circuitry where the generated amplitude depends on a number of activated control components.

Figure 1B:
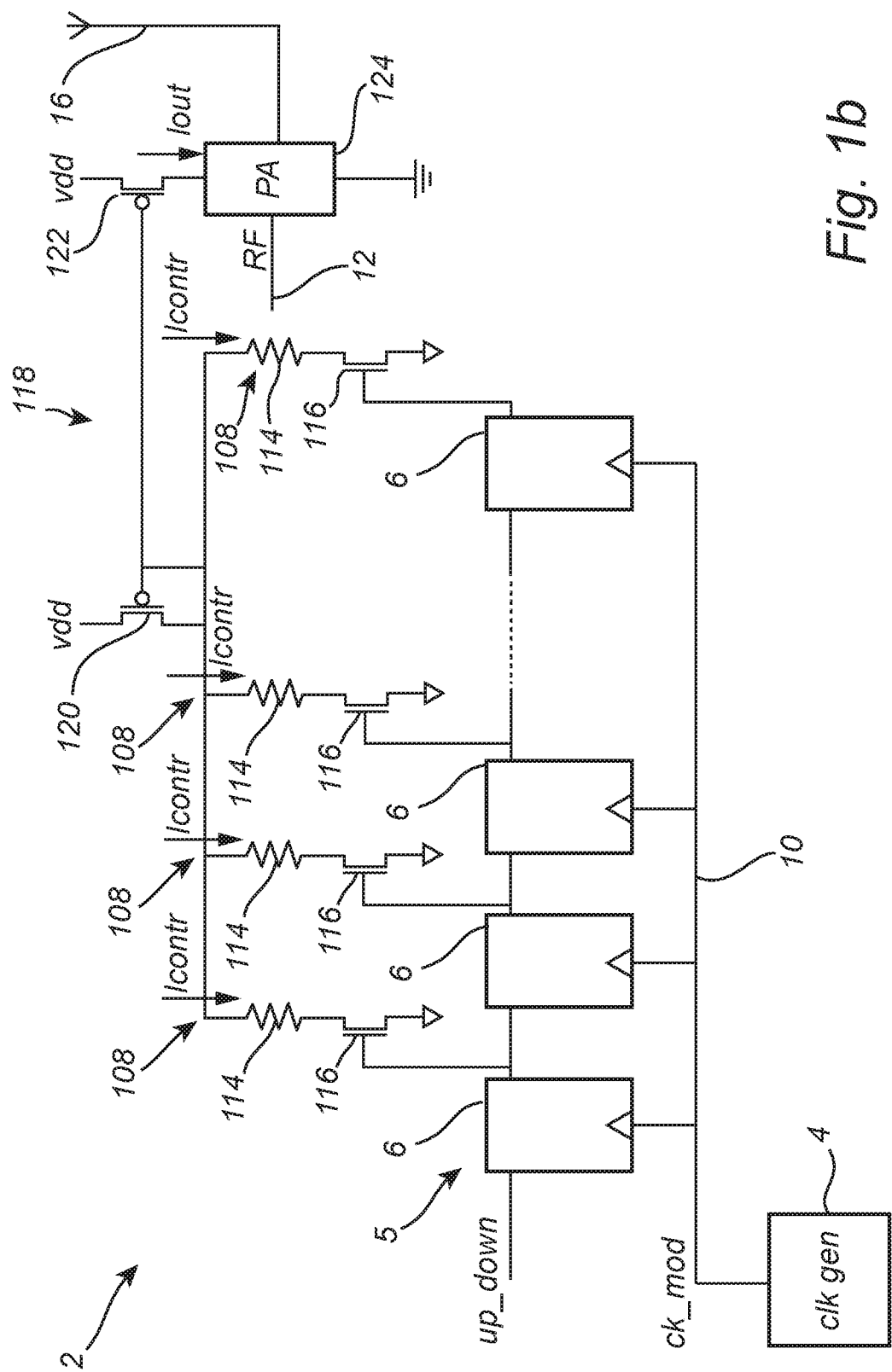

FIG. 1b illustrates an alternative configuration. As in FIG. 1a, a signal generator 2 is an RF transmitter and comprises a shift register 5 and a clock signal generator 4 and is configured to generate an amplitude sweep. However, here, each bit 6 of the shift register controls a respective current source 108, which, if in an activated state, generates a contributor current $I_{contr}$. The contributor currents of each activated current source 108 add up to a total current amounting to $I_{contr}$ times the number n of activated current sources 108. This total current is mirrored by a current mirror 118, comprising a first transistor 120 and a second transistor 122, as a bias current $I_{out}$, which controls an output stage in the form of a PA unit 124, which amplifies an RF signal 12 generated by an RF signal generator (not shown). The output power of the PA unit 124 is controlled by the bias current $I_{out}$. Thus, the current sources 108 form a set of control components, where each current source 108, i.e., control component, of the set of control components is arranged to be switchably activated in parallel in the signal generator 2 and the amplitude of the generated signal has an intrinsic dependence on the number of current sources 108 activated. Each current source 108 comprises a resistor 114 in series with a transistor 116. The transistor 116 of each current source 108 is controlled by a respective bit 6 of the shift register 5.

In both FIG. 1a and FIG. 1b, the shift register is thus embedded in the signal generator 2. This allows one to have the number of control wires independent of the number of control components 8, 108. Compared to, for example, a line-column decoder setup, the number of wires required to control the signal generator 2 is reduced to two, independent of the number of control components implemented. Reducing the number of control wires allow to reduce the power consumption of the signal generator 2.

Again with reference to both FIGS. 1a and 1b, the output of each bit 6 controls the activation of the respective control component 8 and is connected to the input of the next bit 6. The input 8 of the first bit 6, marked "up_down", is used for shifting bits into the switch register, while the same clock signal line 10, marked "ck_mod", is connected to all bits 6 of the shift register. Thus, the control components are arranged to be activated or deactivated in a pre-determined order by shifting, respectively, activation bits or de-activation bits into the shift register. The "up_down" line allows one to pass "up-ramping" or "down-ramping" ("0" or "1") bits into the shift register controlling the control component 6. This will result in, respectively, an increase or decrease of the signal amplitude. "ck_mod" is the clock signal which defines the slope of the amplitude modulation.

A clock signal generator 4 is connected to the clock signal line 10 "ck_mod". It is configured to output a time-modulated clock signal. The clock signal generator 4 may be implemented using a clock and a counter, such that the period counted by the counter, and thus the period of the output clock signal, follows a programmed polynomial, as will be explained in the following.

Figure 2A:
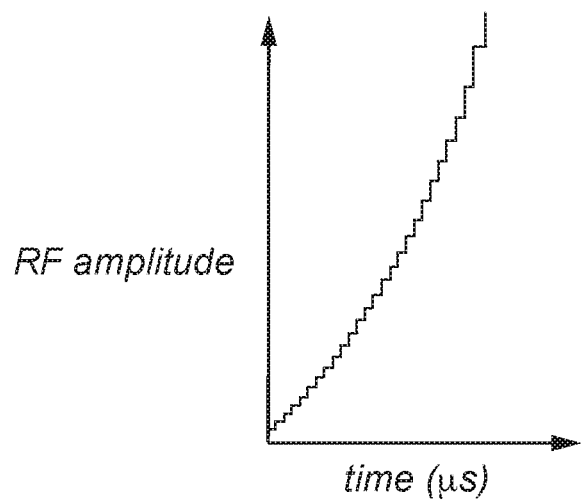
FIG. 2a shows the amplitude sweep of the signal generator when not corrected for non-linearity, according to an example embodiment.

FIG. 2a shows a signal amplitude as a function of time for the signal generator 2, where, in this example, activation bits are shifted into the shift register 5 at regularly spaced intervals in time, as controlled by the clock line 10. Accordingly, the signal amplitude exhibits a stepping behavior at regular time intervals, reflecting a successive activation of control components. Due to the non-linear dependence of the signal amplitude on the number of activated control components 6, the amplitude sweep as a function of time will be non-linear as well, giving the result that the amplitude step is different for each additional control component connected, due to the non-linear dependence of the signal amplitude on the number of activated control components. FIG. 2a shows a generic non linearity for illustration, however, as noted above, as in the signal generator of FIG. 1a, typically there is a square root dependence on the number of connected control components.

Figure 2B:
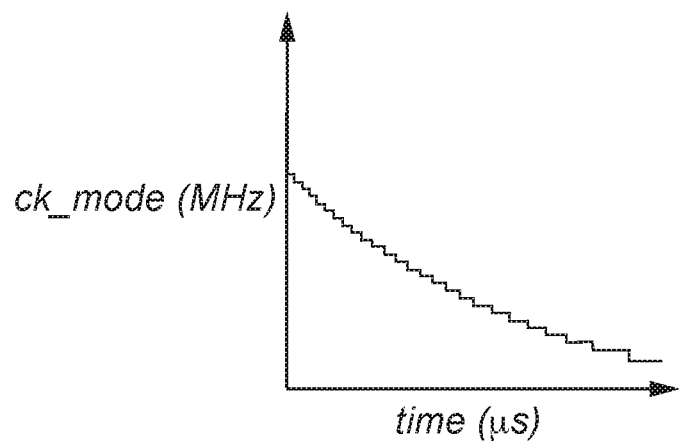
FIG. 2b shows the inverse of the time between two clock signal leading edges as a function of time for a time-modulated clock signal compensating for non-linearity, according to an example embodiment.

FIG. 2b shows a time domain compensation which allows to compensate the amplitude non-linearity of the signal generator during an amplitude sweep, whereby a time-modulated clock signal 10 "ck_mod" is generated and output by the clock signal generator 4. This time-modulated signal has an amplitude variation as a function of time that compensates for the non-linearity of the signal generator 2. This allows one to compensate for the non-linearity of the signal generator. In other words, the frequency of the "ck_mod" clock is adjusted during an amplitude sweep based on the profile of the signal which is to be linearized. FIG. 2b shows an example of the clock frequency, i.e., inverse of the time between two consecutive leading edges of the clock signal 10, as a function of time. In this example, to compensate for the non-linearity of the signal amplitude (cf. FIG. 2a) the clock frequency decreases as a function of time during the amplitude sweep, corresponding to increasing time between each clock signal 10 leading edge.

Given a desired amplitude sweep as a function of time—for example, a linear function, an exponential, a square root function, or a polynomial, such as a square function—and the intrinsic dependence of the signal amplitude on the number of activated control components 6 (cf. FIG. 1), determining the appropriate time between pulses on the clock signal 10 is a straightforward calculation for the skilled person. For example, in a linear ramp between amplitudes $A_A$ and $A_B$ from time t=0 to time t=T, the signal amplitude $\eta_t$ at time t can be written Solving for time t, one gets $$A_t = A_A + \frac{t}{T}(A_B - A_A) \qquad (1)$$

$$t = \frac{T(A_A - A_t)}{A_A - A_B} \qquad (2)$$

For example, the signal amplitude may depend on the number n activated control components as follows:

$$A_n = K\sqrt{nP_{step}}, \qquad (3)$$

wherein K is a—possibly circuit-dependent—proportionality constant. In general, this dependence may be determined, for a given circuit, through calculation, simulation, or suitable calibration methods as known per se.

To find appropriate pulse times, one may substitute $A_n$ of equation 3 for $A_t$ in equation 2. The resulting formula may be approximated by a polynomial, reducing hardware complexity, and allowing for a fast, flexible, and low-power clock signal generator.

Figure 2C:
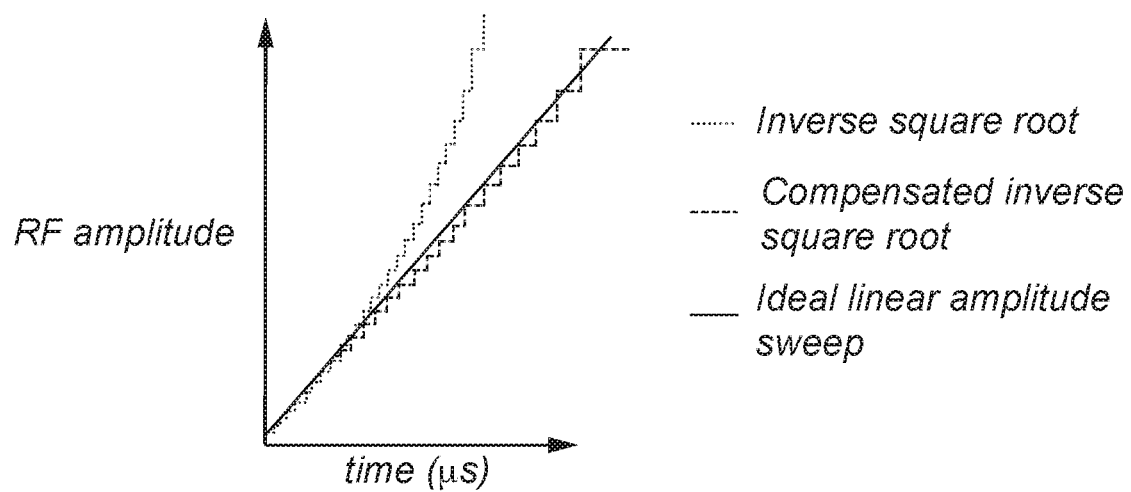
FIG. 2c shows the non-linear profile of FIG. 2a, the linearized signal using the time-modulated clock signal of FIG. 2b, and the resulting amplitude sweep compared to an ideal linear ramp, according to an example embodiment.

FIG. 2c shows with a dashed line the signal amplitude as a function of time when the clock signal of FIG. 2b is applied to the shift register 5. The non-linearity of FIG. 2a (shown with a dotted line for comparison) is compensated for, within the resolution provided by the step-wise activation of control components 6, with good accuracy approximating a linear sweep shown with a solid line. Thus a time domain compensation allows to have a scalable and portable system which can compensate for amplitude sweep non-linearity.

Figure 3:
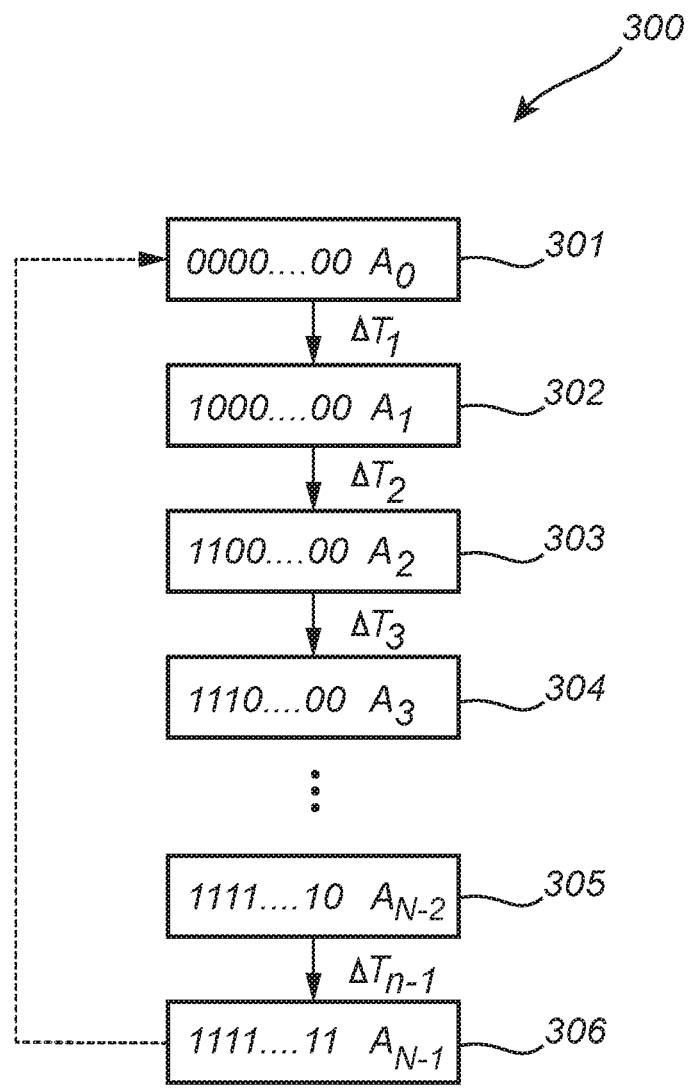
FIG. 3 shows a typical procedure for generating an amplitude sweep, according to an example embodiment.

FIG. 3 shows a typical procedure 300 for generating an amplitude sweep. Each block shows the N bits of the shift register and the signal amplitude. The procedure may for example be implemented in hardware calculating a polynomial approximating equations 2 and 3 above, or in a microcontroller.

In block 301, the amplitude sweep is started by initializing the shift register 5 (cf. FIG. 1) by pushing deactivation ("0") bits into all bits of the shift register 5, so that none of the control component 6 are activated, the signal generator outputting a signal with a first amplitude $A_0$.

In block 302, on leading edge of the clock signal 10, after a time $\Delta T_0$, a first activation bit ("1") is pushed into the shift register, activating a first control component in the signal generator, changing the signal amplitude in a step-wise fashion to a second amplitude $A_1$. The time $\Delta T_0$ is chosen so that the step in signal amplitude $A_1$-$A_0$ matches the desired time profile of the generated amplitude sweep, so the step-wise signal amplitude output matches the desired time profile of the generated amplitude sweep.

Similarly, in block 302, after a further time $\Delta T_1$, a second activation bit ("1") is pushed into the shift register, activating a second control component in the signal generator, so that two control components now are activated, changing the signal amplitude to a third amplitude $A_2$, with the time $\Delta T_2$ similarly chosen so the step in signal amplitude to $A_2$ matches the desired time profile. This is repeated in blocks 303, 304, and 305, until the shift register, in block 306, is filled with activation ("1") bits, corresponding to all control components being activated.

The amplitude sweep may then, optionally, be repeated by returning to block 301.

In this example, activation bits are pushed into the shift register, typically resulting in an upward sweep in signal amplitude in the case of a square root dependence of the signal amplitude. However, the description is equally valid, mutatis mutandis, in the case of pushing deactivation bits into the shift register. In the case of generating a linear amplitude sweep, the times between clock signals $\Delta T_0$, $\Delta T_1$, $\Delta T_2$ will successively get shorter, corresponding to an increase in clock signal frequency, in the case of pushing activation bits into the shift register and generating an upward linear amplitude sweep, and successively longer, corresponding to a decrease in clock signal frequency, in the case of pushing deactivation bits into the shift register and generating a downward linear amplitude sweep.

The disclosure provided above has mainly been described with reference to a limited number of examples. However, as is readily appreciated by a person skilled in the art, other examples than the ones disclosed above are equally possible within the scope of the described embodiments, as defined by the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A signal generator configured to generate a signal with an amplitude sweep, the signal generator having circuitry comprising:

a set of control components, wherein each control component of the set of control components is configured to be switchably activated in parallel in the circuitry such that an amplitude of the signal depends on a particular number of the control components that are activated;

a shift register controllable by a clock line and comprising a serialized configuration of registers that represent a corresponding plurality of bits, each bit of the plurality of bits is configured to control activation of a respective control component of the set of control components to facilitate activation or de-activation of the control component in a pre-determined order by shifting, respectively, activation or de-activation bits into the shift register, wherein the shifting is paced by the clock line; and a clock signal generator configured to output a clock signal with a time modulation on the clock line.

2. The signal generator of claim 1, wherein the signal generator is an RF transmitter and each control component of the set of control components is a power amplifier unit.

3. The signal generator of claim 1, the signal generator further comprising an output stage configured to output the signal, wherein the output stage is controlled by a bias current generated by a bias current source controlled by the set of control components.

4. The signal generator of claim 3, wherein the signal generator is an RF transmitter and the output stage is a power amplifier unit.

5. The signal generator of claim 4, wherein each control component of the set of control components is a current source configured to contribute current to the bias current source.

6. The signal generator of claim 5, wherein the bias current source is a current mirror.

7. The signal generator of claim 6, wherein each control component of the set of control components comprises a resistor in series with a transistor controlled by a bit of the shift register.

8. The signal generator of claim 7, wherein the signal generator is configured to generate the amplitude sweep with a specific time dependence, wherein the time modulation is based on the specific time dependence of the amplitude sweep in relation to the dependence of the amplitude of the signal on the particular number of the control components that are activated, such that the signal generator generates the amplitude sweep with the specific time dependence.

9. The signal generator of claim 8, wherein the specific time dependence of the amplitude sweep is a linear ramp.

10. The signal generator of claim 9, wherein the amplitude sweep is towards increasing amplitude.

11. A method of generating a signal with an amplitude sweep, the method comprising:

shifting activation or de-activation bits into a shift register that comprises a serialized configuration of registers that represent a corresponding plurality of bits, each bit of the plurality of bits is configured to control activation of a respective control component of a set of control components in parallel in circuitry of a signal generator, wherein the control components are activated or de-activated in a pre-determined order by the serial shifting of the activation or deactivation bits through the registers, the amplitude of the signal depends on a particular number of control components that are activated, wherein the shifting is paced by a clock signal having a time modulation.

12. The method of claim 11, wherein the signal generator is an RF transmitter and each control component of the set of control components is a power amplifier unit.

13. The method of claim 11, the signal generator comprising an output stage, the method further comprising:
outputting, by the signal generator, the signal; and
controlling the output stage by a bias current generated by a bias current source controlled by the set of control components.

14. The method of claim 13, wherein the signal generator is an RF transmitter and the output stage is a power amplifier unit.

15. The method of claim 14, wherein each control component of the set of control components is a current source, the method further comprising:
generating, by each of the control components, a current that contributes the bias current source.

16. The method of claim 15, wherein the bias current source is a current mirror.

17. The method of claim 16, wherein each control component of the set of control components comprises a resistor in series with a transistor controlled by a bit of the shift register.

18. The method of claim 17, further comprising:
generating, by the signal generator, the amplitude sweep with a specific time dependence, wherein the time modulation is based on the specific time dependence of the amplitude sweep in relation to the dependence of the amplitude of the signal on the number of control components activated, such that the signal generator generates the amplitude sweep with the specific time dependence.

19. The method of claim 18, wherein the specific time dependence of the amplitude sweep is a linear ramp.

20. The method of claim 19, wherein the amplitude sweep is towards increasing amplitude.

* * * * *